(12) United States Patent
Nojiri et al.

(10) Patent No.: US 6,335,416 B1
(45) Date of Patent: Jan. 1, 2002

(54) POLYIMIDE FILM AND PROCESS FOR PRODUCING THE SAME

(75) Inventors: Hitoshi Nojiri; Koichiro Tanaka, both of Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/530,102

(22) PCT Filed: Aug. 23, 1999

(86) PCT No.: PCT/JP99/04553

§ 371 Date: Apr. 25, 2000

§ 102(e) Date: Apr. 25, 2000

(87) PCT Pub. No.: WO00/11066

PCT Pub. Date: Mar. 2, 2000

(30) Foreign Application Priority Data

Aug. 25, 1998 (JP) .................................... 10-238049
Apr. 16, 1999 (JP) .................................... 11-108698

(51) Int. Cl.[7] ............................... C08G 73/10; C08J 5/18
(52) U.S. Cl. ..................... 528/170; 528/125; 528/128; 528/172; 528/173; 528/179; 528/185; 528/188; 528/220; 528/229; 528/350; 528/353; 428/473.5
(58) Field of Search ..................... 528/125, 128, 528/170, 172, 173, 179, 185, 188, 220, 229, 350, 353; 428/473.5

(56) References Cited

U.S. PATENT DOCUMENTS

| | | | | |
|---|---|---|---|---|
| 5,077,382 A | | 12/1991 | Meterko et al. ............... | 528/353 |
| 5,166,308 A | * | 11/1992 | Kreuz et al. .................. | 528/188 |
| 5,175,240 A | * | 12/1992 | Kreuz et al. .................. | 528/353 |
| 5,175,242 A | * | 12/1992 | Harris ........................... | 528/353 |
| 5,177,176 A | * | 1/1993 | Auman ......................... | 528/353 |
| 5,196,500 A | * | 3/1993 | Kreuz et al. .................. | 528/353 |
| 5,219,977 A | * | 6/1993 | Kreuz ........................... | 528/125 |

FOREIGN PATENT DOCUMENTS

| | | |
|---|---|---|
| JP | 4-56294 A | 2/1992 |
| JP | 5-301960 A | 11/1993 |
| JP | 7-214637 A | 8/1995 |
| JP | 4-293937 | 10/1995 |
| JP | 8-47978 A | 2/1996 |
| JP | 11-172023 A | 6/1999 |

* cited by examiner

Primary Examiner—P. Hampton-Hightower
(74) Attorney, Agent, or Firm—Pillsbury Winthrop LLP

(57) ABSTRACT

A polyimide film, which is produced from polyamide acid prepared through the reaction of p-phenylenebis(trimellitic acid monoester anhydride), oxydiphthalic acid dianhydride, p-phenylenediamine, and 4,4'-diaminodiphenylether in an organic solvent, and which has a high elastic modulus, a high elongation, a low coefficient of linear expansion which is not quite different from that of copper, and a low coefficient of hygroscopic expansion.

20 Claims, No Drawings

POLYIMIDE FILM AND PROCESS FOR PRODUCING THE SAME

This application is the national phase of international application PCT/JP99/04553 filed Aug. 23, 1999 which designated the U.S.

FIELD OF THE INVENTION

The present invention relates to a polyimide film having well-balanced physical properties, which may exhibit low warpage and provide high dimensional stability to a metal-clad product, especially to a copper-clad product.

BACKGROUND OF THE INVENTION

As a polyimide film has such properties as heat resistance, thermal insulation, solvent resistance, and low temperature resistance, it has been widely used as material for parts of a computer and an electric and electronic device controlled by an integrated circuit.

Because of the current trend towards downsizing and slimming of these computers and devices, material for wiring boards and IC packages has been increasingly required to be downsized and slimmed. For this reason, since wiring patterns are more densely formed on these boards and packages, the dimension of polyimide film which is used for flexible wiring boards and TAB (tape-automated bonding) carrier tapes as polyimide laminates is required not to change in dimension under the influence of heat, tension, and moisture absorbance. In addition, it is necessary to provide sufficient strength and stability to a slimed-down laminate.

In order to satisfy the above needs, polyimide film is required to have a low coefficient of linear expansion, a high elastic modulus and a low coefficient of hygroscopic expansion. However, since a polyimide film is laminated onto copper foil in a process of producing a flexible wiring board or an IC package, it is preferable that the coefficient of linear expansion of the film is not quite different from that of copper. If there is a big difference in the coefficient of linear expansion between the film and the copper, the resultant product warps so that it may be difficult to handle. As the result, its dimensional accuracy and yields are deteriorated. For this reason, it is preferable to use a polyimide film having a coefficient of linear expansion approximate to that of copper.

Various attempts have been made to obtain a polyimide film having such properties as described above. For example, a monomer of a rigid structure, namely, a higher linear structure, has been widely used to obtain a polyimide film having a high elastic modulus. However, a large amount of monomers having a higher linear structure reduces a coefficient of hygroscopic expansion of a film, so that the film is no more suitable to be used for a copper-clad laminate.

Alternatively, in order to obtain a polyimide film having a relatively high elastic modulus and not too low coefficient of linear expansion, a polyimide film can be produced by thermally curing a monomer of a relatively linear structure without using chemical imidization agent, thereby releasing orientation stress in the surface direction of the film. However, longer heating time is required in the thermal curing method than in the chemical curing method, so that productivity is decreased. In addition, the use of monomers having a rigid and high linear structure generally spoils the flexibility of the film and therefore decreases bendability, which is one of the advantage of a flexible wiring board.

For semiconductor packaging uses, a polyimide film is desired to have as low a water absorption as possible in terms of reliability of semiconductors, and as low a coefficient of hygroscopic expansion as possible in terms of dimensional stability. In order to reduce a water absorption and a coefficient of hygroscopic expansion, it is effective to reduce imide groups in a molecular structure. For this reason, a long-chain monomer including a plurality of flexible chain in its main chain may often be used to produce a polyimide film. However, the use of such monomer causes the reduction of an elastic modulus and the excessive increase of a coefficient of linear expansion, and consequently spoils the dimensional stability. In extreme cases, the glass transition temperature of the polyimide film falls less than 200° C., so that it is no more suitable to be used as a base film. The monomer of a long linear structure makes it difficult to fold molecular chains, so that sufficient toughness cannot be exhibited. In some cases, it is hard to form a film.

It is well-known that, at temperatures exceeding a glass transition temperature Tg, the storage modulus of a viscoelastic body such as a polyimide film is one order, or, in some cases, two or three orders of magnitude lower than the one at the room temperature. For this reason, where a storage modulus is excessively low at normal film-forming temperatures (e.g. 300° C. or more to 400° C. or less), the film sags too much, which may often make it difficult to produce a flat, unslacked film.

Thus, there are many considerations in the properties of a polyimide film except for a high elastic modulus, a low coefficient of linear expansion, and the reduction of water absorption. However, polyimide film is allowed to have some properties by sacrificing other properties, so that it has been very hard to produce a polyimide film having a plurality of good properties.

DISCLOSURE OF THE INVENTION

As the result of intensive studies to overcome the above disadvantages and to find a polyimide film having such properties as a high elastic modulus, a linear expansion coefficient close to that of copper, sufficient toughness, low water absorption, and a low coefficient of hygroscopic expansion, which is suitable for flexible wiring board with thin wirings and for TAB carrier tape, the present inventors have eventually found the present invention.

In consideration of the above requirements, the present inventors found that a polyimide film of a specific composition has various well-balanced properties and also found the process for producing the same.

The polyimide film of the present invention is produced from polyamide acid prepared through the reaction of p-phenylenebis(trimellitic acid monoester anhydride), oxydiphthalic acid dianhydride, p-phenylenediamine, and 4,4'-diaminodiphenylether in an organic solvent.

In the polyamide film, the content of p-phenylenebis (trimellitic acid monoester anhydride) in the total amount of acid anhydrides is 0 to 90 mol % or more, and preferably 1 to 90 mol %. The content of oxydiphthalic acid dianhydride in the total amount of acid anhydrides is 10 or more to 100 mol %, preferably 10 to 99 mol %. The content of p-phenylenediamine in the total amount of diamines is 25 to 90 mol %, and the content of 4,4'-diaminodiphenylether in the total amount of diamines is 10 to 75 mol %.

The polyimide film of the present invention has an average coefficient of linear expansion of 15 to 30 ppm at the temperature range of 100 to 200° C., a tensile elastic modulus of 4.5 to 8.5 GPa, an elongation at break of 20% or more, a coefficient of hygroscopic expansion of 10 ppm or less, and a glass transition temperature Tg of 200° C. or more.

In the method for producing a polyimide film according to the present invention, a polyimide film can be obtained by dehydration with ring-closure of a polyamide acid polymer obtained by dissolving each of monomers in an organic solvent.

Preferably, in the method of producing a polyimide film according to the present invention, the above dehydration with ring-closure is carried out under the presence of imidization agent of acid anhydride and tertiary amine.

Combined with p-phenylenebis(trimellitic acid monoester anhydride) monomer (hereinafter referred to as TMHQ) and p-phenylenediamine (hereinafter referred to as PDA), polyimide takes on a rodlike structure, which makes it possible to produce a film having a high elastic modulus. The TMHQ has an ester bond in its principal chain, which is rather thermally flexible. Therefore, the coefficient of linear expansion of the polyimide does never decrease sharply, compared to that of polyimide using pyromellitic acid dianhydride. In addition, the ester bond relieves the polarization of imide ring, and has the effect of reducing a water absorption and increasing a coefficient hydroscopic expansion. However, combined with PDA, TMHQ becomes structurally too rigid, and its coefficient of linear expansion is still low and its toughness is not sufficiently high. Alternatively, where TMHQ is copolymerized with diaminodiphenylether for a high elastic modulus, its coefficient of linear expansion reduces too much and its toughness is not sufficiently high.

The polymerization of PDA and diaminodiphenylether with oxydiphthalic acid dianhydride (hereinafter referred to as ODPA) makes it possible to achieve a moderate elastic modulus, enough coefficient of linear expansion to be combined with copper, and a sufficient toughness. Since use of only ODPA as acid anhydride does not reduce a water absorption of polyimide, the polyimide film of the present invention is quite effectively used to copolymerize TMHQ, so that a coefficient of hygroscopic expansion is reduced and various desired properties are maintained.

Thus, the present invention makes it possible to provide a polyimide film having well-balanced properties such as a high elastic modulus, a high elongation at break, a low coefficient of linear expansion, and a low coefficient hygroscopic expansion, while a certain heat resistance and adhesiveness are maintained.

DESCRIPTION OF THE PREFERRED EMBODIMENT

A polyimide film of the present invention will be described below with reference to the accompanying drawings.

The term "monomer" used herein indicates either diamine or tetracarboxylic dianhydride.

In this specification, a tensile elastic modulus and an elongation at break, both of which are properties of polyimide film, are measured in accordance with ASTM-D882, respectively. An average coefficient of linear expansion is an average of values measured by the thermochemical analyzer TMA8140 manufactured by RIGAKU CORPORATION under the presence of nitrogen at a heating rate of 10° C./min in a temperature range of 100° C. to 200° C. A coefficient of hygroscopic expansion is determined as follows: Applying weight to a film (about 3 gram weight is applied to a sample film of 5 mm×20 mm) so as not to let the film sag; Under this condition, allow the film to take up moisture at a constant humidity of 30 RH % until it reaches to the saturation point, and then measure the dimension of the film; After that, allow the film to take up moisture at a constant humidity of 90 RH % and then measure the dimension of the film in the same manner; and based on the obtained dimensions, determine the dimensional change per 1% difference in relative humidity. A glass transition temperature (Tg) and a storage modulus at high temperatures are measured in a tensile mode at a programming rate of 3° C./min. with a Dynamic Mechanical Spectrometer (DMS 200 available from Seiko Instruments Inc.) and obtained from the peak value of tan δ and E' at each temperature.

The polyimide film of the present invention is produced from polyamide acid prepared by the method for synthesizing polyamide acid, which is known to the ordinary skilled in the art.

An organic solvent which is used in a polymerizing step in this invention can be various solvents which are known to the ordinary skilled in the art. For example, it is preferable to use high polar solvents having high solubility in polyamide acid as organic solvents. Poor solvents can be added to these high polar solvents. Examples of high polar solvents include: amides such as N,N-dimethylformamide and N,N-dimethylacetamide; pyrolidones such as N-methyl-2-pyrolidone; phenols such as phenol, p-chlorophenol, and o-chlorophenol; and the like. Examples of poor solvents include toluene, tetrahydrofuran, acetone, methyl ethyl ketone, methanol, ethanol, and the like. Solubility can be increased by mixing these solvents together and adjusting a solubility parameter.

In the present invention, in order to synthesize polyamide acid, TMHQ having a following structural formula

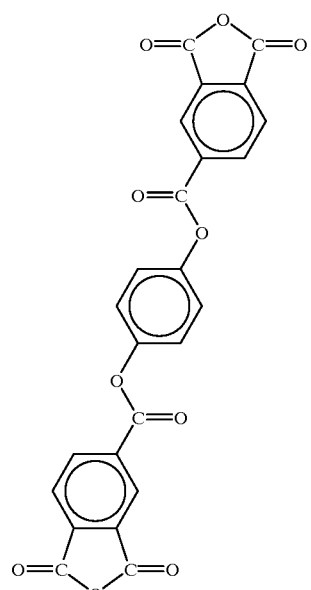

and ODPA having a following structural formula

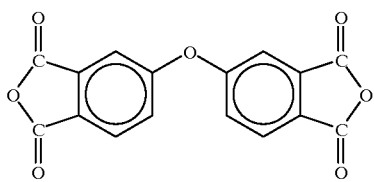

can be used as acid anhydrides, and PDA having a following structural formula

and ODA having a following structural formula can be used as diamines.

The adding order of each monomer is not especially limited, but various method can be used to synthesize polyamide acid. The most common method is the method in which all the diamines are dissolved in a solvent, tetracarboxylic acid dianhydride is added by portions with adjusting viscosity to make it substantially equimolecular to the diamines, and then the rest of the tetracarboxylic acid dianhydride or its solution in a suitable solvent is added to make it equimolecular to the diamines. However, the adding method is not limited to this method. Depending on the adding order, the properties of the film can be delicately controlled in some methods. Examples of these methods include: a method in which ODA and PDA are dissolved in a solvent and then TMHQ and subsequently ODPA are added; a method in which two kinds of diamines are dissolved in a solvent and then two kinds of acid anhydrides, that is, ODPA and TMHQ are added in this order; a method in which two kinds of diamines are dissolved in a solvent, and then a mixture of two kinds of acid anhydrides added; and a method in which either of two diamines is dissolved in a solvent, either of two acid anhydrides is added thereto, and then the other diamine and subsequently the other acid anhydride are added thereto; and the like. Since a diamine can be added in a plurality of steps, a wide variety of methods can be offered. These methods enable the various properties of the film to be delicately controlled. For example, a polyimide film which is produced from polyamide synthesized by a method in which ODA and PDA are dissolved in an organic solvent and then TMHQ and ODPA are added thereto in this order is more preferable, because it has a higher glass transition temperature than the one which is produced from polyamide synthesized by a method in which acid anhydrides are added in reverse order. In particular, preferably usable polyimide is the one produced from polyamide acid synthesized by: a method in which ODA is dissolved in an organic solvent to prepare organic solvent solution and TMHQ, PDA and ODPA are added one by one thereto; a method in which PDA is dissolve in an organic solvent to prepare organic solvent solution and ODPA, ODA, ODPA and TMHQ are added one by one thereto; or a method in which PDA is dissolved in an organic solvent to prepare organic solvent solution and ODPA, ODA, TMHQ and ODPA are added one by one thereto, because such-obtained film exhibits a high storage modulus of 200 MPa at the temperature range of 300° C. or more to 400° C. or less.

In any cases, the total molar quantity of diamine compounds is substantially equal to that of acid anhydride compounds. The total molar quantities are not exactly equal but substantially equal to each other. This is because if they are exactly equal to each other, polymerization degree and the velocity of the solution are excessively increased, so that the solution becomes too hard to be dealt with. The ratio of the total molar quantity of diamine compounds to that of acid anhydrides is 0.95 to 1.05, and more particularly 0.98 to 1.02. It is particularly preferable that the ratio is not 1:1.

Although the proportion of each monomer is not particularly limited, it is preferable that the proportions of TMHQ and ODPA in the total acid anhydrides and PDA and ODA in the total diamines are 0 mol % to 90 mol % or less, 10 mol % or more to 100 mol %, 25 mol % or more to 90 mol % or less, and 10 mol % or more to 75 mol % or less, respectively. More preferably, the proportions of TMHQ and ODPA in the total acid anhydrides are 1 mol % or more to 90 mol % or less and 10 mol % or more to 99 mol % or less, respectively. Most preferably, the proportions of TMHQ and ODPA in the total acid anhydrides and PDA and ODA in the total diamines are 5 mol % or more to 50 mol % or less, 50 mol % or more to 95 mol % or less, 50 mol % or more to 90 mol % or less, 10 mol % or more to 50 mol % or less.

The properties of polyimide film to be obtained can be delicately controlled by adding small amount of monomer components other than these four monomers. In this case the proportions of the additional diamine components in the total diamines should be 10 mol % or less, and the proportions of the additional acid anhydride components in the total acid anhydrides should be 15 mol % or less. The copolymerization of these monomers in substantially less than above proportions enables the polyimide film to have preferable level of hygroscopic, thermal, and mechanical properties. Examples of small amount of monomers to be used as diamines include dimethylbenzidine, 2,2'-bis(4-aminophenoxyphenyl)propane, 4,4'-bis(4-aminophenoxy) biphenyl, and their halogen substitute such as fluorine. Examples of monomers to be used as acid anhydride include 3,3', 4,4'-biphenyltetracarboxylic dianhydride, 3,3',4,4'-benzophenonetetracarboxylic dianhydride, pyromellitic dianhydride, 3,3',4,4'-diphenylsulfone tetracarboxylic dianhydride, and the like.

Although the polymerization reaction temperature of polyamide acid is not particularly limited, it is preferably 60° C. or less, and more preferably 40° C. or less. If it is too high, the ring-opening reaction of acid anhydride groups may easily occur, which may often inhibit a reaction that forms polyamide acid.

Polymerization reaction is preferably carried out in the presence of inert gas such as nitrogen or argon, however, it can be carried out under other conditions.

The concentration of polyamide acid in the solution is preferably 5 to 30 wt %, and more preferably 10 to 25 wt %. If the concentration is lower than the above range, more amount of solvents is required, so that it takes more time to dry a film after forming the film. Alternatively, if it is higher, the velocity of the solution becomes too high to form a film.

Although the velocity of polyamide acid solution is not particularly limited as far as it is sufficient enough to form a film, it should be about 100 to 10,000 poises, and more preferably 500 to 600 poises at the temperature of 22° C. If the solution has excessively low velocity, it may adversely affect the properties of the film and make it difficult to form a film having uniform thickness. Alternatively, if the solution has excessively high velocity, the solution is hard to be stirred and more siring force is required to form a film, which causes inconvenience.

The thus-prepared polyamide acid solution can be formed into film and then imidized to obtain polyimide film.

Generally, imidization can be carried out by the thermal curing method, in which the polyamide acid is dehydrated by heating, or the chemical curing method, in which a dehydrating and/or imidization catalyst is used. Imidization can be carried out by either one of methods or a combination thereof. The chemical curing method in which dehydrating agent and catalyst are added to the solution and then heated and dried is more efficient than the thermal curing method, and makes it possible to provide excellent properties to film. Even if neither dehydrating agent nor catalyst is used, it may be possible to produce a film having properties equal to the above by using four monomers of the present invention and adding a drawing step to the production adding a drawing step to the production step. However, the chemical curing method is preferable in terms of productivity.

Examples of such dehydrating agents include aliphatic acid anhydrides such as acetic anhydride, and aromatic acid anhydride.

Examples of imidization catalysts include tertiary amines such as pyridine, α-picoline, β-picoline, γ-picoline, trimethylamine, dimethylaniline, triethylamine, and iso-quinoline.

An example of the chemical curing method will be its described below, however, the method is not limited by that in this invention. In the chemical curing method, polyimide film is obtained by: adding more than a stoichiometric amount of dehydrating agents and a catalystic amount of tertiary amines to the polyamide acid solution; casting the solution over a base or a film of organic compound such as polyethylene terephthalate, a dram or an endless belt to shape it into a film; drying it for about 5 to 90 minutes at the temperature of 150° C. or less to form a self-supporting film of polyamide acid copolymer; peeling it off from the base; securing its end portions; heating it gradually up to 100 to 500° C. to imidize it; cooling it down; and taking it off from the base.

The thermal curing method may comprise the same steps as the chemical curing method, but it is not limited by this. In the thermal curing method, polyamide acid solution can be cast over a base such as a film, a dram, and an endless belt to form a film, and then heated.

In the producing of the film, the addition of heat deterioration inhibitor may prevent the deterioration of the film during firing. Further, the addition of other additives may prevent the deterioration of the film during producing. Examples of heat deterioration inhibitors include deterioration inhibitors containing phosphate such as triphenylphosphate and the like, benzophenone and its substitution product, and the like. Examples of other additives include a metal, organic metallic compound, or glass filler, and the like.

The present invention will be more clearly understood by referring to the Examples below. However, these Examples should not be construed to limit the invention in any way.

EXAMPLES

Example 1

25.1 g (about 62.5 mol % of the total diamines) of PDA and 27.9 g (about 37.5 mol % of the total diamines) of ODA were dissolved in 750 g of dimethylacetamide under nitrogen atmosphere in an ice bath. 52.7 g (about 31 mol % of the total acid anhydrides) of TMHQ was added thereto by portions with stirring. Thereafter, 79.4 g (about 69 mol % of the total acid anhydrides) of ODPA was added by portions. Thus polyamide acid solution having a viscosity of 2500 poises was obtained at the temperature of 23° C.

100 g of this polyamide acid solution was cooled down to about 0° C., and then 13.5 g of acetic anhydride and 4.1 g of isoquinoline were added and homogeneously stirred. It was then cast over the SUS board so as to ensure a film thickness of 50 μm after firing, and dried for 5 minutes at 125° C. by hot air. The film was peeled off from the SUS board and under the condition that four sides of the film were secured, it was dried for 1.5 minutes at 170° C., for 1.5 minutes at 250° C., for 3 minutes at 350° C., and 3 minutes at 430° C. to form a polyimide film. Results of the measurement of a tensile elastic modulus, an elongation at break, a coefficient of linear expansion, a coefficient of hydroscopic expansion, and Tg are shown in TABLE 1.

Example 2

20.6 g (about 55 mol % of the total diamines) of PDA and 31.2 g (about 45 mol % of the total diamines) of ODA were dissolved in 750 g of dimethylacetamide under nitrogen atmosphere in an ice bath. 79.4 g (about 50 mol % of the total acid anhydrides) of TMHQ was added thereto by portions with stirring. Thereafter, 53.8 g (about 50 mol % of the total acid anhydrides) of ODPA was added by portions. Thus polyamide acid solution having a viscosity of 2500 poises was obtained at the temperature of 23° C.

By the same method as described in Example 1, a polyimide film was obtained from this polyamide acid solution, and properties of the film were measured. Results of the measurements are shown in Table 1.

Example 3

Polyimide film was obtained by the same method as described in Example 1, except that ODPA and TMHQ are added in reverse order, and then properties of the film were measured. Results of the measurements are shown in Table 1.

TABLE 1

|  | Component (mol %) |  | Tensile elastic modulus (GPa) | Elongation at break (%) | Coefficient of linear expansion (ppm) | Coefficient of hydroscopic expansion (ppm) | Glass transition temperature (Tg) (° C.) |
|---|---|---|---|---|---|---|---|
| EXAMPLE 1 | PDA | 62.5 | 6 | 30 | 23 | 5 | 255 |
|  | ODA | 3.75 |  |  |  |  |  |
|  | TMHQ | 31 |  |  |  |  |  |
|  | ODPA | 69 |  |  |  |  |  |
| EXAMPLE 2 | PDA | 55 | 6.5 | 25 | 20 | 5 | 260 |
|  | ODA | 45 |  |  |  |  |  |
|  | TMHQ | 50 |  |  |  |  |  |
|  | ODPA | 50 |  |  |  |  |  |
| EXAMPLE 3 | PDA | 62.5 | 6 | 28 | 22 | 5 | 245 |

TABLE 1-continued

| Component (mol %) | | Tensile elastic modulus (GPa) | Elongation at break (%) | Coefficient of linear expansion (ppm) | Coefficient of hydroscopic expansion (ppm) | Glass transition temperature (Tg) (° C.) |
|---|---|---|---|---|---|---|
| ODA | 37.5 | | | | | |
| ODPA | 69 | | | | | |
| TMHQ | 31 | | | | | |

Comparative Examples 1 to 4

By the same method as described in the above Examples, all the diamine components were dissolved in dimethylacetamide and then acid anhydrides were added to prepare polyamide acid solution having a total solid concentration of 20% and a viscosity of 2500 poises. Components and their mole percentages are shown in TABLE 2, wherein PMDA represents pyromellitic dianhydride, and BPDA represents 3,3',4,4'-biphenyltetracarboxylic dianhydride. By the same method as described in the above Examples, polyimide films were obtained from the polyamide acid solution, and then properties of the films were measured. Results of the measurements are shown in Table 2.

Example 5

28.6 g (about 37.5 mol % of the total diamines) of ODA, 38.6 g (about 22.1 mol % of the total acid dianhydrides) of TMHQ, and 25.7 g (about 62.5 mol % of the total diamines) of PDA were dissolved in 815 g of dimethylacetamide under nitrogen atmosphere in an ice bath. 92.1 g (about 77.9 mol % of the acid dianhydrides) of ODPA was added thereto by portions with stirring. Thus polyamide acid solution having a viscosity of 2500 poises was obtained at the temperature of 23° C.

By the same method as described in Example 4, polyimide film was obtained from this polyamide acid solution. In a step of producing the film, no slack was found. In the same

TABLE 2

| | Component (mol %) | | Tensile elastic modulus (GPa) | Elongation at break (%) | Coefficient of linear expansion (ppm) | Coefficient of hydroscopic expansion (ppm) | Glass transition temperature (Tg) (° C.) |
|---|---|---|---|---|---|---|---|
| COMPARATIVE EXAMPLE 1 | ODA | 100 | 3 | 90 | 32 | 20 | Undetected |
| | PMDA | 100 | | | | | |
| COMPARATIVE EXAMPLE 2 | PDA | 60 | 8.5 | 5 | 18 | 6 | 270 |
| | ODA | 40 | | | | | |
| | TMHQ | 100 | | | | | |
| COMPARATIVE EXAMPLE 3 | PDA | 100 | 8 | 20 | 14 | 12 | Undetected |
| | BPDA | 100 | | | | | |
| COMPARATIVE EXAMPLE 4 | PDA | 50 | 5.5 | 20 | 9 | 6 | 350 |
| | ODA | 50 | | | | | |
| | PMDA | 50 | | | | | |
| | TMHQ | 50 | | | | | |

Example 4

28.8 g (about 37.5 mol % of the total diamines) of ODA, 35.1 g (about 20 mol % of the total acid dianhydrides) of TMHQ, and 25.9 g (about 62.5 mol % of the total diamines) of PDA were dissolved in 815 g of dimethylacetamide under nitrogen atmosphere in an ice bath. 95.2 g (about 80 mol % of the total acid dianhydrides) of ODPA was added thereto by portions with stirring. Thus polyamide acid solution having a viscosity of about 2500 poises was obtained at the temperature of 23° C.

100 g of this polyamide acid solution was cooled down to about 0° C., and 12.9 g of acetic anhydride and 4.0 g of isoquinoline were added and homogeneously stirred. It was then cast over the SUS board so as to ensure a film thickness of 50 μm after firing, and dried for 5 minutes at 125° C. by hot air. The film was peeled off from the SUS board and under the condition that four sides of the film are secured, it was dried for 1.5 minutes at 170° C., for 1.5 minutes at 250° C., for 3 minutes at 350° C., and 3 minutes at 430° C. to form a polyimide film. In a step of producing the film, no slack was found in the film. Results of the measurement of a tensile elastic modulus, an elongation at break, a coefficient of linear expansion, a coefficient of hydroscopic expansion, Tg, and storage modulus at 350° C. are shown in TABLE 3.

manner as described in Example 4, properties of the film were measured. Results of the measurements are shown in Table 3.

Example 6

33.1 g (about 37.5 mol % of the total diamines) of ODA, 62.7 g (about 31 mol % of the total acid dianhydrides) of TMHQ, and 29.8 g (about 62.5 mol % of the total diamines) of PDA were dissolved in 780 g of dimethylacetamide under nitrogen atmosphere in an ice bath. 94.4 g (about 69 mol % of the acid dianhydrides) of ODPA was added thereto by portions with stirring. Thus polyamide acid solution having a viscosity of 2500 poises was obtained at the temperature of 23° C.

By the same method as described in Example 4, polyimide film was obtained from this polyamide acid solution. No slack was found in a step of producing the film. In the same manner as described in Example 4, properties of the film were measured. Results of the measurements are shown in Table 3.

Example 7

31.5 g (about 42.9 mol % of the total diamines) of ODA, 52.2 g (about 31 mol % of the total acid dianhydrides) of TMHQ, and 22.7 g (about 57.1 mol % of the total diamines) of PDA were dissolved in 815 g of dimethylacetamide under nitrogen atmosphere in an ice bath. 78.6 g (about 69 mol % of the acid dianhydrides) of ODPA was added thereto by portions with stirring. Thus polyamide acid solution having a viscosity of about 2500 poises was obtained at the temperature of 23° C.

By the same method as described Example 4, polyimide film was obtained from this polyamide acid solution. No slack was found in a step of producing the film. In the same manner as described in Example 4, properties of the film were measured. Results of the measurements are shown in Table 3.

ODPA, 27.8 g (about 37.5 mol % of the total diamines) of ODA were dissolved in 815 g of dimethylacetamide under nitrogen atmosphere in an ice bath. 8.6 g (about 7.5 mol % of the acid dianhydrides) of ODPA was added thereto by portions with stirring. Thereafter, 52.7 g (about 31 mol % of the total acid dianhydrides) of TMHQ was added by portions. Thus polyamide acid solution having a viscosity of 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 4.

TABLE 3

|  | Component (mol %) |  | Tensile elastic modulus (GPa) | Elongation at break (%) | Coefficient of linear expansion (ppm) | Coefficient of hydroscopic expansion (ppm) | Glass transition temperature (Tg) (° C.) | Storage or elastic modulus at 350° C. (MPa) |
|---|---|---|---|---|---|---|---|---|
| EXAMPLE 4 | PDA | 62.5 | 6 | 40 | 24 | 7 | 246 | 600 |
|  | ODA | 37.5 |  |  |  |  |  |  |
|  | TMHQ | 20 |  |  |  |  |  |  |
|  | ODPA | 80 |  |  |  |  |  |  |
| EXAMPLE 5 | PDA | 62.5 | 6 | 28 | 23 | 3 | 245 | 910 |
|  | ODA | 37.5 |  |  |  |  |  |  |
|  | TMHQ | 22.1 |  |  |  |  |  |  |
|  | ODPA | 77.9 |  |  |  |  |  |  |
| EXAMPLE 6 | PDA | 62.5 | 7 | 44 | 20 | 2 | 230 | 760 |
|  | ODA | 37.5 |  |  |  |  |  |  |
|  | ODPA | 69 |  |  |  |  |  |  |
|  | TMHQ | 31 |  |  |  |  |  |  |
| EXAMPLE 7 | PDA | 57.1 | 6 | 24 | 24 | 2 | 230 | 770 |
|  | ODA | 42.9 |  |  |  |  |  |  |
|  | TMHQ | 31 |  |  |  |  |  |  |
|  | ODPA | 69 |  |  |  |  |  |  |

Example 8

27.5 g (about 62.5 mol % of the total diamines) of PDA, 77.6 g (about 61.5 mol % of the total acid dianhydrides) of ODPA, 30.5 g (about 37.5 mol % of the total diamines) were dissolved in 815 g of dimethylacetamide under nitrogen atmosphere in an ice bath. 46.7 g (about 37 mol % of the acid dianhydrides) of ODPA was added thereto by portions with stirring. Thereafter, 2.8 g (about 1.5 mol % of the total acid dianhydrides) of TMHQ was added by portions. Thus polyamide acid solution having a viscosity of 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 4.

Example 9

25.1 g (about 62.5 mol % of the total diamines) of PDA, 70.8 g (about 61.5 mol % of the total acid dianhydrides) of Example 10

21.3 g (about 53.9 mol % of the total diamines) of PDA, 59.9 g (about 52.9 mol % of the total acid dianhydrides) of ODPA, 33.7 g (about 46.1 mol % of the total diamines) of ODA were dissolved in 815 g of dimethylacetamide under nitrogen atmosphere in an ice bath. 18.2 g (about 16.1 mol % of the total acid dianhydrides) of ODPA was added thereto by portions with stirring. Thereafter, 51.9 g (about 31 mol % of the total acid dianhydrides) of TMHQ was added by portions. Thus polyamide acid solution having a viscosity of about 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 4.

TABLE 4

|  | Component (mol %) |  | Tensile elastic modulus (GPa) | Elongation at break (%) | Coefficient of linear expansion (ppm) | Coefficient of hydroscopic expansion (ppm) | Glass transition temperature (Tg) (° C.) | Storage or elastic modulus at 350° C. (MPa) |
|---|---|---|---|---|---|---|---|---|
| EXAMPLE 8 | PDA | 62.5 | 6 | 27 | 25 | 8 | 286 | 910 |
|  | ODA | 37.5 |  |  |  |  |  |  |

TABLE 4-continued

|  | Component (mol %) | | Tensile elastic modulus (GPa) | Elongation at break (%) | Coefficient of linear expansion (ppm) | Coefficient of hydroscopic expansion (ppm) | Glass transition temperature (Tg) (° C.) | Storage or elastic modulus at 350° C. (MPa) |
|---|---|---|---|---|---|---|---|---|
|  | TMHQ | 1.5 | | | | | | |
|  | ODPA | 98.5 | | | | | | |
| EXAMPLE 9 | PDA | 62.5 | 7 | 24 | 18 | 2 | 232 | 980 |
|  | ODA | 37.5 | | | | | | |
|  | TMHQ | 31 | | | | | | |
|  | ODPA | 69 | | | | | | |
| EXAMPLE 10 | PDA | 53.9 | 6 | 25 | 19 | 2 | 226 | 670 |
|  | ODA | 46.1 | | | | | | |
|  | ODPA | 69 | | | | | | |
|  | TMHQ | 31 | | | | | | |

Example 11

25.7 g (about 62.5 mol % of the total diamines) of PDA, 72.7 g (about 61.5 mol % of the total acid dianhydrides) of ODPA, 28.6 g (about 37.5 mol % of the total diamines) of ODA were dissolved in 815 g of dimethylacetamide under nitrogen atmosphere in an ice bath. 38.6 g (about 22.1 mol % of the total acid dianhydrides) of TMHQ was added thereto by portions with stirring. Thereafter, 19.4 g (about 16.4 mol % of the total acid dianhydrides) of ODPA was added by portions. Thus polyamide acid solution having a viscosity of about 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 5.

Example 12

25.7 g (about 62.5 mol % of the total diamines) of PDA, 64.8 g (about 54.8 mol % of the total acid dianhydrides) of ODPA, 28.6 g (about 37.5 mol % of the total diamines) of ODA were dissolved in 815 g of dimethylacetamide under nitrogen atmosphere in an ice bath. 38.6 g (about 22.1 mol % of the total acid dianhydrides) of TMHQ was added thereto by portions with stirring. Thereafter, 27.3 g (about 23.1 mol % of the total acid dianhydrides) of ODPA was added by portions. Thus polyamide acid solution having a viscosity of about 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 5

Example 13

25.7 g (about 62.5 mol % of the total diamines) of PDA, 58.7 g (about 49.7 mol % of the total acid dianhydrides) of ODPA, 28.6 g (about 37.5 mol % of the total diamines) of ODA were dissolved in 815 g of dimethylacetamide under nitrogen atmosphere in an ice bath. 38.6 g (about 22.1 mol % of the total acid dianhydrides) of TMHQ was added thereto by portions with stirring. Thereafter, 33.3 g (about 28.2 mol % of the total acid dianhydrides) of ODPA was added by portions. Thus polyamide acid solution having a viscosity of about 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 5.

Example 14

25.7 g (about 62.5 mol % of the total diamines) of PDA, 55.7 g (about 47.1 mol % of the total acid dianhydrides) of ODPA, 28.6 g (about 37.5 mol % of the total diamines) of ODA were dissolved in 815 g of dimethylacetamide under nitrogen atmosphere in an ice bath. 38.6 g (about 22.1 mol % of the total acid dianhydrides) of TMHQ was added thereto by portions with stirring. Thereafter, 36.4 g (about 30.8 mol % of the total acid dianhydrides) of ODPA was added by portions. Thus polyamide acid solution having a viscosity of about 2500 poises was obtained at the temperature of 23° C.

By the same method as described in Example 4, polyimide film was obtained from this polyamide acid solution. No slack was found in a step of producing the film. Properties of the film were measured in the same manner as described in Example 4. Results of the measurements are shown in Table 5.

TABLE 5

|  | Component (mol %) | | Tensile elastic modulus (GPa) | Elongation at break (%) | Coefficient of linear expansion (ppm) | Coefficient of hydroscopic expansion (ppm) | Glass transition temperature (Tg) (° C.) | Storage or elastic modulus at 350° C. (MPa) |
|---|---|---|---|---|---|---|---|---|
| EXAMPLE 11 | PDA | 62.5 | 7 | 24 | 18 | 3 | 248 | 840 |
|  | ODA | 37.5 | | | | | | |
|  | TMHQ | 22.1 | | | | | | |
|  | ODPA | 77.9 | | | | | | |

TABLE 5-continued

|  | Component (mol %) | | Tensile elastic modulus (GPa) | Elongation at break (%) | Coefficient of linear expansion (ppm) | Coefficient of hydroscopic expansion (ppm) | Glass transition temperature (Tg) (° C.) | Storage or elastic modulus at 350° C. (MPa) |
|---|---|---|---|---|---|---|---|---|
| EXAMPLE 12 | PDA | 62.5 | 6 | 30 | 21 | 3 | 248 | 740 |
|  | ODA | 37.5 |  |  |  |  |  |  |
|  | TMHQ | 22.1 |  |  |  |  |  |  |
|  | ODPA | 77.9 |  |  |  |  |  |  |
| EXAMPLE 13 | PDA | 62.5 | 6 | 24 | 23 | 3 | 249 | 850 |
|  | ODA | 37.5 |  |  |  |  |  |  |
|  | TMHQ | 22.1 |  |  |  |  |  |  |
|  | ODPA | 77.9 |  |  |  |  |  |  |
| EXAMPLE 14 | PDA | 62.5 | 6 | 26 | 24 | 3 | 248 | 650 |
|  | ODA | 37.5 |  |  |  |  |  |  |
|  | TMHQ | 22.1 |  |  |  |  |  |  |
|  | ODPA | 77.9 |  |  |  |  |  |  |

Industrial Applicability

Unlike a conventional polyimide film, the polyimide film of the present invention has an excellent hygroscopic property, especially an excellent property of hygroscopic expansion. Although it has a high elastic modulus, it has a higher coefficient of linear expansion than copper. For this reason, it can exhibit excellent warping properties when it is used for a copper-clad board and TAB carrier tape. The polyimide film of the present invention has excellent flexibility and heat-resistance without impairing any properties necessary for a polyimide base film, so that it can be used for increasingly downsizing electronic equipment.

What is claimed is:

1. A polyimide film comprising a polyamide acid prepared by reacting p-phenylenebis(trimellitic acid monoester anhydride), oxydiphthalic acid dianhydride, p-phenylenediamine, and 4,4'-diaminodiphenylether in an organic solvent.

2. The polyimide film according to claim 1, wherein the content of p-phenylenebis(trimellitic acid monoester anhydride) in the total amount of acid dianhydrides is 1 to 90 mol %; the content of oxydiphthalic acid dianhydride in the total amount of acid dianhydrides is 10 to 99 mol %; the content of p-phenylenediamine in the total amount of diamines is 25 to 90 mol %; and the content of 4,4'-diaminodiphenylether in the total amount of diamines is 10 to 75 mol %.

3. The polyimide film according to claim 1, having:
an average coefficient of linear expansion of 15 to 30 ppm at the temperature of 100° C. or more to 200° C. or less;
a tensile elastic modulus of 4.5 to 8.5 GPa;
n elongation at break of 20% or more;
a coefficient of hygroscopic expansion of 10 ppm or less, and
a glass transition temperature of 200° C. or more.

4. The polyimide film according to claim 1, having a storage modulus of 200 MPa or more at the temperature range of 300° C. or less.

5. A method for producing the polyimide film according to claim 1, comprising the steps of:
dissolving 4,4'-diaminodiphenylether and p-phenylenediamine in an organic solvent to prepare organic solvent solution;
adding p-phenylenebis(trimellitic acid monoester anhydride) acid copolymer to the organic solvent solution;
adding oxydiphthalic acid dianhydride to prepare polyamide acid copolymer; and subsequently
dehydrating the polyamide acid copolymer to effect ring closure by using and acid anhydride and a tertiary amine.

6. A method for producing the polyimide film according to claim 1, comprising the steps of:
dissolving 4,4'-diaminodiphenylether in an organic solvent to prepare organic solvent solution;
adding p-phenylenebis(trimellitic acid monoester anhydride), p-phenylenediamine, oxydiphthalic acid dianhydride to prepare polyamide acid copolymer; and subsequently
dehydrating the polyamide acid copolymer to effect ring closure by using an acid anhydride and a tertiary amine.

7. A method for producing the polyimide film according to claim 1, comprising the steps of:
dissolving p-phenylenediamine and subsequently oxydiphthalic acid dianhydride in an organic solvent to prepare organic solvent solution;
adding 4,4'-diaminodiphenylether, oxydiphthalic acid dianhydride, and p-phenylenebis(trimellitic acid monoester anhydride) one by one to prepare polyamide acid copolymer; and subsequently
dehydrating the polyamide acid copolymer to effect ring closure by using an acid anhydride and a tertiary amine.

8. A method for producing the polyimide film according to claim 1, comprising the steps of:
dissolving p-phenylenediamine and subsequently oxydiphthalic acid dianhydride in an organic solvent to prepare organic solvent solution;
adding 4,4'-diaminodiphenylether, p-phenylenebis (trimellitic acid monoester anhydride) and oxydiphthalic acid dianhydride to the organic solvent solution one by one to prepare polyamide acid copolymer; and subsequently
dehydrating the polyamide acid copolymer to effect ring closure by an using acid anhydride and a tertiary amine.

9. A method for producing the polyamide film according to claim 5, wherein the content of p-phenylenebis(trimellitic acid monoester anhydride) in the total amount of acid dianhydrides is 1 to 90 mol %; the content of oxydiphthalic acid dianhydride in the total amount of acid dianhydrides is 10 to 99 mol %; the content of p-phenylenediamine in the total amount of diamines is 25 to 90 mol %; and the content of 4,4'-diaminodiphenylether in the total amount of diamines is 10 to 75 mol %.

10. A method for producing the polyamide films according to claim 9, further comprising a step of forming the polyimide film having
an average coefficient of linear expansion of 15 to 30 ppm at the temperature of 100° C. or more to 200° C. or less;
a tensile elastic modulus of 4.5 to 8.5 GPa;

an elongation at break of 20% or more;

a coefficient of hygroscopic expansion of 10 ppm or less, and a glass transition temperature of 200° C. or more, and/or a storage modulus of 200 MPa or more at the temperature from 300° C. to 400° C.

11. A method for producing the polyamide film according to claim 6, wherein the content of p-phenylenebis(trimellitic acid monoester anhydride) in the total amount of acid dianhydrides is 1 to 90 mol %; the content of oxydiphthalic acid dianhydride in the total amount of acid dianhydrides is 10 to 99 mol %; the content of p-phenylenediamine in the total amount of diamines is 25 to 90 mol %; and the content of 4,4'-diaminodiphenylether in the total amount of diamines is 10 to 75 mol %.

12. A method for producing the polyamide films according to claim 11, further comprising a step of forming the polyimide film having an average coefficient of linear expansion of 15 to 30 ppm at the temperature of 100° C. or more to 200° C. or less;

a tensile elastic modulus of 4.5 to 8.5 GPa;

an elongation at break of 20% or more;

a coefficient of hygroscopic expansion of 10 ppm or less, and a glass transition temperature of 200° C. or more, and/or a storage modulus of 200 MPa or more at the temperature from 300° C. to 400° C.

13. A method for producing the polyamide film according to claim 7, wherein the content of p-phenylenebis(trimellitic acid monoester anhydride) in the total amount of acid dianhydrides is 1 to 90 mol %; the content of oxydiphthalic acid dianhydride in the total amount of acid dianhydrides is 10 to 99 mol %; the content of p-phenylenediamine in the total amount of diamines is 25 to 90 mol %; and the content of 4,4'-diaminodiphenylether in the total amount of diamines is 10 to 75 mol %.

14. A method for producing the polyamide films according to claim 13, further comprising a step of forming the polyimide film having an average coefficient of linear expansion of 15 to 30 ppm at the temperature of 100° C. or more to 200° C. or less;

a tensile elastic modulus of 4.5 to 8.5 GPa;

an elongation at break of 20% or more;

a coefficient of hygroscopic expansion of 10 ppm or less, and a glass transition temperature of 200° C. or more, and/or a storage modulus of 200 MPa or more at the temperature from 300° C. to 400° C.

15. A method for producing the polyamide film according to claim 8, wherein the content of p-phenylenebis(trimellitic acid monoester anhydride) in the total amount of acid dianhydrides is 1 to 90 mol %; the content of oxydiphthalic acid dianhydride in the total amount of acid dianhydrides is 10 to 99 mol %; the content of p-phenylenediamine in the total amount of diamines is 25 to 90 mol %; and the content of 4,4'-diaminodiphenylether in the total amount of diamines is 10 to 75 mol %.

16. A method for producing the polyamide films according to claim 15, further comprising a step of forming the polyimide film having an average coefficient of linear expansion of 15 to 30 ppm at the temperature of 100° C. or more to 200° C. or less;

a tensile elastic modulus of 4.5 to 8.5 GPa;

an elongation at break of 20% or more;

a coefficient of hygroscopic expansion of 10 ppm or less, and a glass transition temperature of 200° C. or more, and/or a storage modulus of 200 MPa or more at the temperature from 300° C. to 400° C.

17. A method for producing the polyamide films according to claim 5, further comprising:

adding the acid anhydride and the tertiary amine to the organic solution of said polyamide acid copolymer;

casting the organic solution of said polyamide acid copolymer over a base;

drying said cast solution to obtain a self-supporting film.

18. A method for producing the polyamide films according to claim 6, further comprising:

adding the acid anhydride and the tertiary amine to the organic solution of said polyamide acid copolymer;

casting the organic solution of said polyamide acid copolymer over a base;

drying said cast solution to obtain a self-supporting film.

19. A method for producing the polyamide films according to claim 7, further comprising:

adding the acid anhydride and the tertiary amine to the organic solution of said polyamide acid copolymer;

casting the organic solution of said polyamide acid copolymer over a base;

drying said cast solution to obtain a self-supporting film.

20. A method for producing the polyamide films according to claim 8, further comprising:

adding the acid anhydride and the tertiary amine to the organic solution of said polyamide acid copolymer;

casting the organic solution of said polyamide acid copolymer over a base;

drying said cast solution to obtain a self-supporting film.

* * * * *